United States Patent
Fattal et al.

(10) Patent No.: US 9,991,676 B2
(45) Date of Patent: Jun. 5, 2018

(54) SMALL-MODE-VOLUME, VERTICAL-CAVITY, SURFACE-EMITTING LASER

(75) Inventors: David A. Fattal, Mountain View, CA (US); Marco Fiorentino, Mountain View, CA (US); Jingjing Li, Palo Alto, CA (US); Michael Renne Ty Tan, Menlo Park, CA (US); Wayne V. Sorin, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 372 days.

(21) Appl. No.: 13/880,316

(22) PCT Filed: Oct. 29, 2010

(86) PCT No.: PCT/US2010/054740
§ 371 (c)(1),
(2), (4) Date: Apr. 18, 2013

(87) PCT Pub. No.: WO2012/057788
PCT Pub. Date: May 3, 2012

(65) Prior Publication Data
US 2013/0209110 A1  Aug. 15, 2013

(51) Int. Cl.
*H01S 5/00* (2006.01)
*H01S 5/183* (2006.01)
(Continued)

(52) U.S. Cl.
CPC ........ *H01S 5/18386* (2013.01); *H01S 5/0424* (2013.01); *H01S 5/18311* (2013.01);
(Continued)

(58) Field of Classification Search
CPC ............... H01S 5/18386; H01S 5/0424; H01S 5/18311; H01S 5/423; H01S 5/18358; H01S 5/18316
(Continued)

(56) References Cited

U.S. PATENT DOCUMENTS 5,140,149 A * 8/1992 Sakata et al. ................. 257/436
5,726,805 A    3/1998 Kaushik et al.
(Continued)

FOREIGN PATENT DOCUMENTS

CN    2571034 Y    9/2003
CN    1507684 A    6/2004
(Continued)

OTHER PUBLICATIONS

Connie J. Chang-Hasnain, Ye Zhou, Michael C. Y. Huang, and Christopher Chase, "High-Contrast Grating VCSELs", May/Jun. 2009, IEEE Journal of Selected Topics in Quantum Electronics, vol. 15, No. 3.*

(Continued)

*Primary Examiner* — Vu A Vu
(74) *Attorney, Agent, or Firm* — Wagner Blecher, LLP

(57) ABSTRACT

A small-mode-volume, vertical-cavity, surface-emitting laser (VCSEL). The VCSEL includes an active structure to emit light upon injection of carriers, and two reflecting structures at least one of which is a grating reflector structure. The active structure is disposed within at least one of the reflecting structures. The reflecting structures are configured as a vertical-cavity resonator of small mode-volume. An optical-bus transmitter including a plurality of small-mode-volume VCSELs, and a system including at least one optical bus and at least one optical-bus transmitter in a digital-information processor, or a data-processing center, are also provided.

15 Claims, 11 Drawing Sheets

(51) Int. Cl.
*H01S 5/042* (2006.01)
*H01S 5/42* (2006.01)

(52) U.S. Cl.
CPC ....... *H01S 5/18316* (2013.01); *H01S 5/18358* (2013.01); *H01S 5/423* (2013.01)

(58) Field of Classification Search
USPC ...................................................... 372/50.11
See application file for complete search history.

(56) References Cited

U.S. PATENT DOCUMENTS

| | | | |
|---|---|---|---|
| 6,195,381 | B1 | 2/2001 | Botez et al. |
| 6,590,267 | B1 | 7/2003 | Goodwin-Johansson et al. |
| 6,683,898 | B2 | 1/2004 | Ostergaard et al. |
| 6,697,405 | B2 | 2/2004 | Kitatani et al. |
| 6,707,548 | B2 | 3/2004 | Kreimer et al. |
| 6,741,624 | B2 | 5/2004 | Mears et al. |
| 6,785,320 | B1 | 8/2004 | Amos et al. |
| 6,818,959 | B2 | 11/2004 | Montelius et al. |
| 6,894,836 | B2 | 5/2005 | Christenson |
| 6,914,231 | B1 | 7/2005 | Stone |
| 7,096,498 | B2 | 8/2006 | Judge |
| 7,106,920 | B2 | 9/2006 | Liu |
| 7,173,764 | B2 | 2/2007 | Carr et al. |
| 7,180,930 | B2 | 2/2007 | Takaki et al. |
| 7,221,691 | B2 | 5/2007 | Johnson et al. |
| 7,302,130 | B2 | 11/2007 | Stone |
| 7,304,781 | B2 | 12/2007 | Chang-Hasnain et al. |
| 7,386,205 | B2 | 6/2008 | Wang et al. |
| 7,535,944 | B1* | 5/2009 | Guilfoyle et al. ......... 372/50.11 |
| 7,680,371 | B2 | 3/2010 | Cheben et al. |
| 7,693,205 | B2 | 4/2010 | Uchida |
| 9,184,562 | B2 | 11/2015 | Chung |
| 2002/0073338 | A1 | 6/2002 | Burrows et al. |
| 2002/0080493 | A1 | 6/2002 | Tsai et al. |
| 2003/0048824 | A1 | 3/2003 | Shinagawa et al. |
| 2003/0235229 | A1 | 12/2003 | Deng et al. |
| 2003/0235370 | A1 | 12/2003 | Taillaert et al. |
| 2005/0013334 | A1 | 1/2005 | Watanabe et al. |
| 2006/0232776 | A1 | 10/2006 | Hairston et al. |
| 2006/0245464 | A1 | 11/2006 | Hori et al. |
| 2006/0262250 | A1 | 11/2006 | Hobbs |
| 2006/0273284 | A1 | 12/2006 | Hirose |
| 2007/0115553 | A1 | 5/2007 | Chang-Hasnain et al. |
| 2007/0153860 | A1* | 7/2007 | Chang-Hasnain et al. ......... 372/50.124 |
| 2007/0165214 | A1 | 7/2007 | Wu et al. |
| 2007/0201527 | A1 | 8/2007 | Hori et al. |
| 2008/0267236 | A1 | 10/2008 | Sigalas et al. |
| 2009/0196319 | A1 | 8/2009 | Hori et al. |
| 2009/0324248 | A1 | 12/2009 | Shiraki |
| 2010/0128749 | A1 | 5/2010 | Amann et al. |
| 2010/0316083 | A1* | 12/2010 | Chang-Hasnain et al. ......... 372/50.11 |
| 2011/0188119 | A1 | 8/2011 | Mathai et al. |
| 2012/0105962 | A1 | 5/2012 | Fattal et al. |

FOREIGN PATENT DOCUMENTS

| | | |
|---|---|---|
| CN | 1595221 | 3/2005 |
| CN | 1916668 | 2/2007 |
| JP | 06-283812 A | 10/1994 |
| JP | 11-186653 A | 7/1999 |
| JP | 2001-094209 A | 4/2001 |
| JP | 2004-534383 A | 9/2002 |
| JP | 2005-150505 A | 6/2005 |
| JP | 2007-234724 A | 9/2007 |
| JP | 2009-188153 A | 8/2009 |
| JP | 2010-114404 | 5/2010 |
| JP | 2012-517705 | 8/2010 |
| KR | 10-20080009280 | 1/2008 |
| KR | 10-20080099172 | 11/2008 |
| WO | WO-2006125196 | 11/2006 |
| WO | WO-2011008216 | 1/2011 |
| WO | WO-2012105945 | 8/2012 |

OTHER PUBLICATIONS

International Search Report and Written Opinion, Aug. 2, 2011. PCT Application No. PCT/US2010/054740.
International Search Report and Written Opinion, Sep. 27, 2010. PCT Application No. PCT/US2010/022632.
Srinivasan, Kartik, et al.. "Fabrication-tolerant high quality factor photonic crystal microcavities." arXiv preprint physics/0312060 (2003).
Berseth, C.-A. et al., "Vertical cavity surface emitting lasers incorporating structured mirrors patterned by electron-beam lithography", J. Vac. Sci. Technol. B, Nov. 1999, vol. 17, No. 6, pp. 3222-3225.
Chang-Hasnain, C. J. et al., "Tunable VCSEL Using High Contrast Grating", OSA CLE02009, May 2009.
Christensen, et al., "Low-distortion hybrid optical shuffle concept", Optics Letters, Feb. 1, 1999, pp. 169-171, vol. 24, No. 3.
European Search Report (Supplementary), Apr. 26, 2013, EP Application No. 09849901.5.
Fattal, David, et al., "Flat Dielectric Grating Reflectors with High Focusing Power", 8 pages, <http://arvix.org/PScache/arxiv/pdf/1001/1 001.3711v1.pdf>, Jan. 21, 2010.
Hewlett-Packard Development Company, L.P., "Non-Periodic Grating Reflectors With Focusing Power and Methods for Fabricating", Application No. PCT/US09/51026, Filed Jul. 17, 2009.
Hewlett-Packard Development Company, LP., "Optical Devices Based on Diffraction Gratings", Application No. PCT/US09/58006, Filed Sep. 23, 2009.
International Search Report, Apr. 20, 2010, PCT Application No. PCT/US2009/051026.
International Search Report, Sep. 28, 2011, PCT Application No. PCT/US2011/023219.
International Search Report, May 31, 2010, PCT Application No. PCT/US2009/058006, Filed Sep. 23, 2009.
Marino, Francesco, et al., "Single Mode Operation and Transverse Mode Control in VCSELs Induced by Frequency Selective Feedback", 3 pages, Dept. de Fisica Interdisciplinar, Institute Mediteraneo de Estudios Avanzados (CSIC-UIB), C/Miquel Marques 21, E-07190 Esporles, Spain.
Zhou, Ye, et al., "Transverse Mode Control in High-Contrast Subwavelength Grating VCSEL", 2 pages, Department of Electrical Engineering and Computer Sciences, University of California, Berkeley, USA, May 6-11, 2007.
Haroldo T. Hattori, et al., Analysis of hybrid photonic crystal vertical cavity surface emitting lasers, Optical Society of America, Jul. 2003, vol. 11, No. 15, pp. 1799-1808.

\* cited by examiner

SMALL-MODE-VOLUME, VERTICAL-CAVITY, SURFACE-EMITTING LASER

RELATED APPLICATIONS

This Application is related to PCT Patent Application, Serial Number PCT/US2010/022632 by David A. Fattal, et al., filed on Jan. 29, 2010, entitled "VERTICAL-CAVITY SURFACE-EMITTING LASERS WITH NON-PERIODIC GRATING," and assigned to the assignee of the present invention.

TECHNICAL FIELD

Examples of the present invention relate generally to vertical-cavity, surface-emitting lasers (VCSELs).

BACKGROUND

Vertical-cavity, surface-emitting lasers (VCSELs) are an interesting family of semiconductor lasers offering the prospect of many novel applications. For example, the vertical cavity configuration allows VCSELs to be used in arrays for data-communication applications. Moreover, VCSELS are easier to fabricate in wafer batch-fabrication processes than conventional semiconductor lasers, which employ reflectors orthogonal to the wafer substrate that are difficult to fabricate with high yields. Consequently, VCSELS have generated great interest in the data-communication industry. Thus, engineers and scientists engaged in semiconductor laser research have a keen interest in advancing VCSEL technology.

DESCRIPTION OF THE DRAWINGS

The accompanying drawings, which are incorporated in and form a part of this specification, illustrate examples of the invention and, together with the description, serve to explain the examples of the invention:

FIG. 1B, are examples, and an example system including at least one optical bus and at least one optical-bus transmitter, in accordance with one or more examples of the present invention.

Figure 1A:
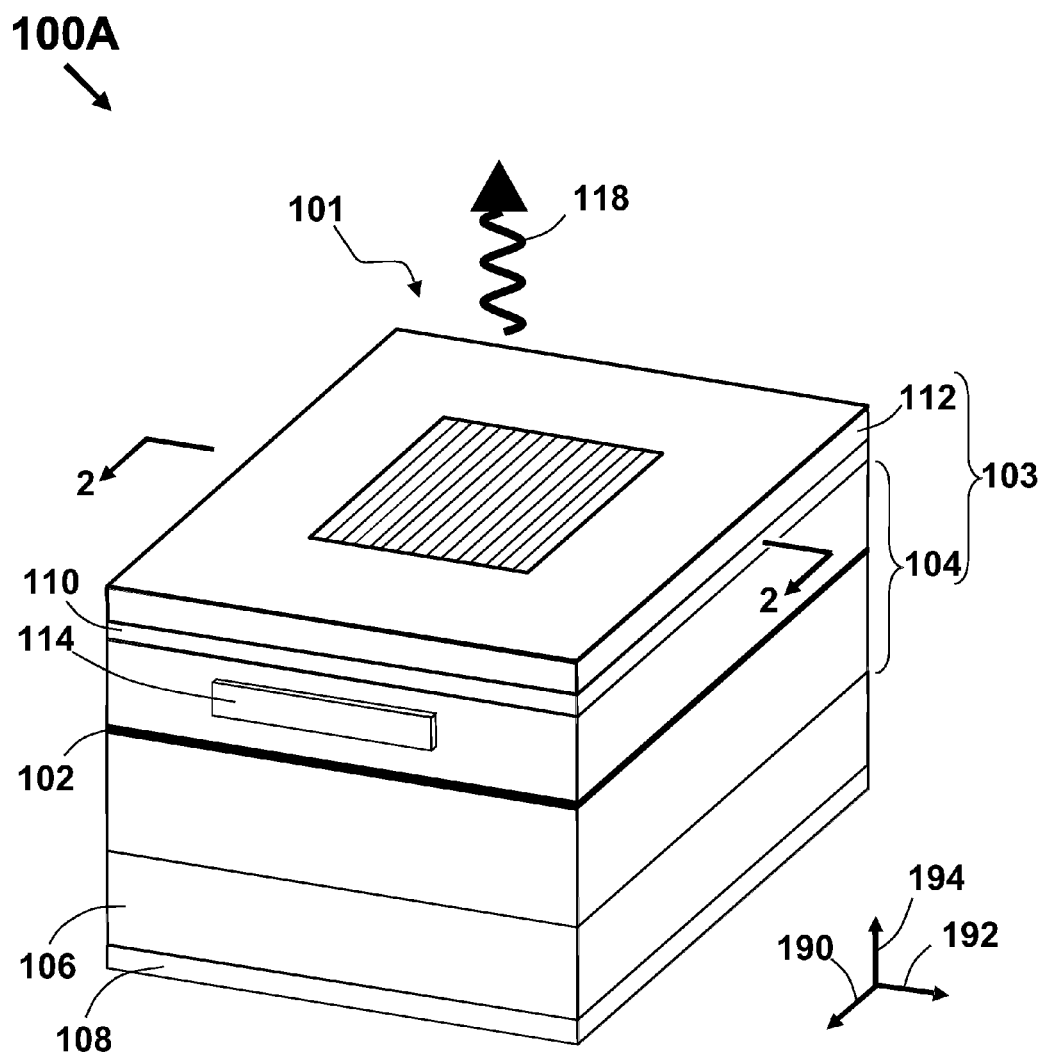
FIG. 1A is a perspective view of one example of a small-mode-volume, vertical-cavity, surface-emitting laser (VCSEL) in which an active structure is disposed in a distributed Bragg reflector, in accordance with one or more examples of the present invention.

The drawings referred to in this description should not be understood as being drawn to scale except if specifically noted.

DESCRIPTION OF EXAMPLES

Reference will now be made in detail to the alternative examples of the present invention. While the invention will be described in conjunction with the alternative examples, it will be understood that they are not intended to limit the invention to these examples. On the contrary, the invention is intended to cover alternatives, modifications and equivalents, which may be included within the spirit and scope of the invention as defined by the appended claims.

Furthermore, in the following description of examples of the present invention, numerous specific details are set forth in order to provide a thorough understanding of the present invention. However, it should be noted that examples of the present invention may be practiced without these specific details. In other instances, well known methods, procedures, and components have not been described in detail as not to unnecessarily obscure examples of the present invention. Throughout the drawings, like components are denoted by like reference numerals, and repetitive descriptions are omitted for clarity of explanation if not necessary.

Examples of the present invention include a small-mode-volume, vertical-cavity, surface-emitting laser (VCSEL). The small-mode-volume VCSEL includes an active structure to emit light upon injection of carriers, and two reflecting structures at least one of which is a grating reflector structure. In one or more examples of the present invention, the small-mode-volume VCSEL includes a distributed Bragg reflector being the other of the two reflecting structures. In such a case, the DBR is disposed below the grating reflector structure. In accordance with one or more examples of the present invention, the active structure may be disposed within at least one of the reflecting structures. Thus, in accordance with one or more examples of the present invention, the active structure may be disposed within the grating reflector structure. Alternatively, in accordance with one or more examples of the present invention, the active structure may be disposed within the DBR, without limitation thereto, as the other reflecting structure may include a structure other than a DBR.

Thus, in accordance with one or more examples of the present invention, by integrating the active structure within one or the other of the DBR and the grating reflector structure, the total thickness of a VCSEL may be reduced. Moreover, this geometrical arrangement of disposing the active structure within one or the other of the DBR and of the grating reflector structure allows for novel carrier injection schemes with reduced path-length for carrier transport that potentially also reduce the series electrical resistance of the small-mode-volume VCSEL. Consequently, in one or more examples of the present invention, the reflecting structures, for example, a DBR, without limitation thereto, and the grating reflector structure, can be configured as a vertical-cavity resonator of small mode-volume, in a small-mode volume VCSEL that is distinguished by its high bandwidth, low power dissipation, high thermal stability, stable output amplitude as a function of input power, low frequency drift and ease of fabrication from what is known in the art.

Examples of the present invention also include an optical-bus transmitter that includes a plurality of the small-mode-volume VCSELs configured as optical output drivers for bit-lines of an optical-bus. Other examples of the present invention include a system including at least one optical-bus and at least one optical-bus transmitter. Other examples of the present invention include a system including a digital-information processor that includes at least one optical-bus and at least one optical-bus transmitter to transfer information between one component and another component coupled to the optical-bus in the digital-information processor. Similarly, yet other examples of the present invention include a system including a data-processing center that includes at least one optical-bus and at least one optical-bus transmitter to transfer information between one digital-information processor and at least one other digital-information processor coupled to the optical-bus in the data-processing center. Thus, subsequently described examples of the present invention for the small-mode-volume VCSEL may also be understood as being incorporated within the following environments: the optical-bus transmitter, the system including at least one optical-bus and at least one optical-bus transmitter, the digital-information processor, and the data-processing center.

With reference now to FIG. 1A, in accordance with one or more examples of the present invention, a perspective view 100A is shown of one example of a small-mode-volume VCSEL 101 in which an active structure 102 is disposed in a DBR 104. In accordance with one or more examples of the present invention, the small-mode-volume VCSEL 101 includes two reflecting structures 103 at least one of which is a grating reflector structure 112, and the other a DBR 104, and an active structure 102. The DBR 104 is disposed below the grating reflector structure 112. The active structure 102 is disposed within DBR 104, and is to emit light 118 upon injection of carriers. As used herein, the active structure 102 refers to a layered structure that produces light 118 through recombination of a non-equilibrium population of injected carriers in the conduction band of the active structure 102 with a non-equilibrium population of injected carriers in the valence band of the active structure 102; by way of example without limitation thereto, the active structure 102 includes one or more quantum wells (QWs), as is known in the art.

With further reference to FIG. 1A, in accordance with one or more examples of the present invention, the combination of DBR 104 and the grating reflector structure 112 provide a structure, referred to herein as a "resonator," such that the grating reflector structure 112 and DBR 104 act like mirrors that produce repeated reflections of the light 118 produced by the active structure 102, which leads to stimulated emission of radiation from the active structure 102 with amplification of the intensity of light 118, as is known in the art. Thus, in one or more examples of the present invention, DBR 104 and the grating reflector structure 112 are configured as a vertical-cavity resonator of small mode-volume, because, in this example of the small-mode-volume VCSEL 101, the active structure 102 is disposed within the DBR 104. In accordance with one or more examples of the present invention, the small-mode-volume VCSEL 101 also includes a spacer layer 110 that is disposed below the grating reflector structure 112, and between the grating reflector structure 112 and DBR 104.

With further reference to FIG. 1A, in accordance with one or more examples of the present invention, the small-mode-volume VCSEL 101 is provided with a substrate 106 upon which DBR 104 may be fabricated by an epitaxial growth technique, such as liquid phase epitaxy (LPE), vapor phase epitaxy (VPE) or molecular beam epitaxy (MBE), by way of example without limitation thereto, as is known in the art. For example, DBR 104 may include: a gallium arsenide (GaAs)/aluminum gallium arsenide ($Al_xGa_{1-x}As$) multilayer (ML) given by the formula $[GaAs/Al_xGa_{1-x}As]_n$, a gallium nitride (GaN)/aluminum gallium nitride ($Al_xGa_{1-x}N$) ML given by the formula $[GaN/Al_xGa_{1-x}N]_n$, or alternatively a gallium phosphide (GaP)/aluminum gallium phosphide ($Al_xGa_{1-x}P$) ML given by the formula $[GaP/Al_xGa_{1-x}P]_n$, where the subscript n denotes the number of periods of $[GaPn/Al_xGa_{1-x}Pn]$ bilayers, where Pn denotes a pnictogen, a group V element. Moreover, the active structure 102 and the grating reflector structure 112 may similarly be fabricated as ML structures by such processes, as are known in the art.

With further reference to FIG. 1A, in accordance with one or more examples of the present invention, each of DBR 104, the grating reflector structure 112 and the active structure 102 are fabricated from materials selected from the group of III-V compounds, II-VI compounds and alloys and combinations thereof, as is known in the art. For example, the active structure 102 may be based on QWs including bilayers selected from the group of consisting of [GaAs/$Al_xGa_{1-x}As$], [GaP/$Al_xGa_{1-x}P$], and [GaN/$Al_xGa_{1-x}N$], by way of example without limitation thereto. The band-gap of the active structure 102 is determined by the materials and structure of the bilayers, which in turn determines the wavelength of light 118 produced by the active structure 102. Consequently, the number and thicknesses of the various layers in DBR 104 are determined by the specified reflectivity of DBR 104 at the wavelength of light 118 emitted from the active structure 102, as is known in the art. Thus, in one or more examples of the present invention, the light 118 emitted from the small-mode-volume VCSEL 101 may have a wavelength from about 400 nanometers to about 1300 nanometers, which depends on the band gap associated with the band structure determined by the structure and the materials specified for the active structure 102.

With further reference to FIG. 1A, in accordance with one or more examples of the present invention, a triad of vectors 190, 192 and 194 is provided in FIG. 1A, to ease description. The triad of vectors 190, 192 and 194 is right handed; thus, the vectors 190, 192 and 194 may be mutually orthogonal unit vectors such that the vector product of vector 190 with vector 192 produces vector 194. The triad of vectors 190, 192 and 194 provides a reference for determining the relationship of other drawings for examples of the present invention with respect to FIG. 1A. As the small-mode-volume VCSEL 101 is essentially a layered structure, the terms of art "upper," "top," or "above" refer to layers of the small-mode-volume VCSEL 101 that are normal to vector 194 and that lie towards the top of FIG. 1A; the terms of art "lower," "bottom," or "below" refer to layers of the small-mode-volume VCSEL 101 that are normal to vector 194 and that lie towards the bottom of FIG. 1A. These terms of art are relative, and conventional, with respect to a structure, such as the small-mode-volume VCSEL 101, which is fabricated with a process that essentially lays successive layers down over the substrate 106, as is known in the art. Thus, the term of art, "vertical," as used herein refers to a sequence of layers from top to bottom of the small-mode-volume VCSEL 101.

Similarly, with further reference to FIG. 1A, the term of art "front" refers to a side of the small-mode-volume VCSEL 101 that is normal to vector 190 and that lies towards the front of the drawing of small-mode-volume VCSEL 101; the term of art "back" refers to a side of the small-mode-volume VCSEL 101 that is normal to vector 190 and that lies towards the back of the drawing of small-mode-volume VCSEL 101. Likewise, the term of art "left" refers to a side of the small-mode-volume VCSEL 101 that is normal to vector 192 and that lies towards the left side of FIG. 1A; the term of art "right" refers to a side of the small-mode-volume VCSEL 101 that is normal to vector 192 and that lies towards the right side of FIG. 1A. Thus, the term of art, "lateral," as used herein refers to a sequence of structures from front to back, from back to front, or alternatively, from left to right, or from right to left, of the small-mode-volume VCSEL 101.

Figure 2A:
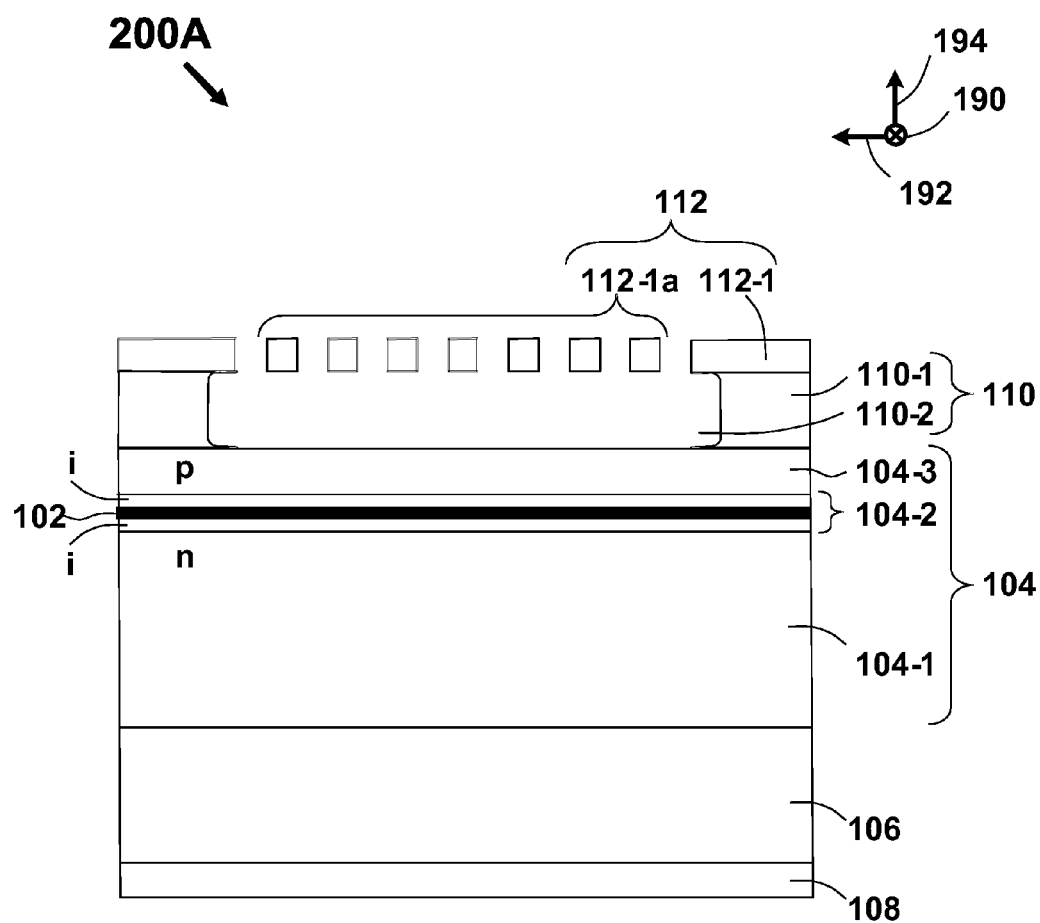
FIG. 2A is a cross-sectional elevation view, through line 2-2 of FIG. 1A, of one example of the small-mode-volume VCSEL of FIG. 1A, in accordance with one or more examples of the present invention.
Figure 2B:
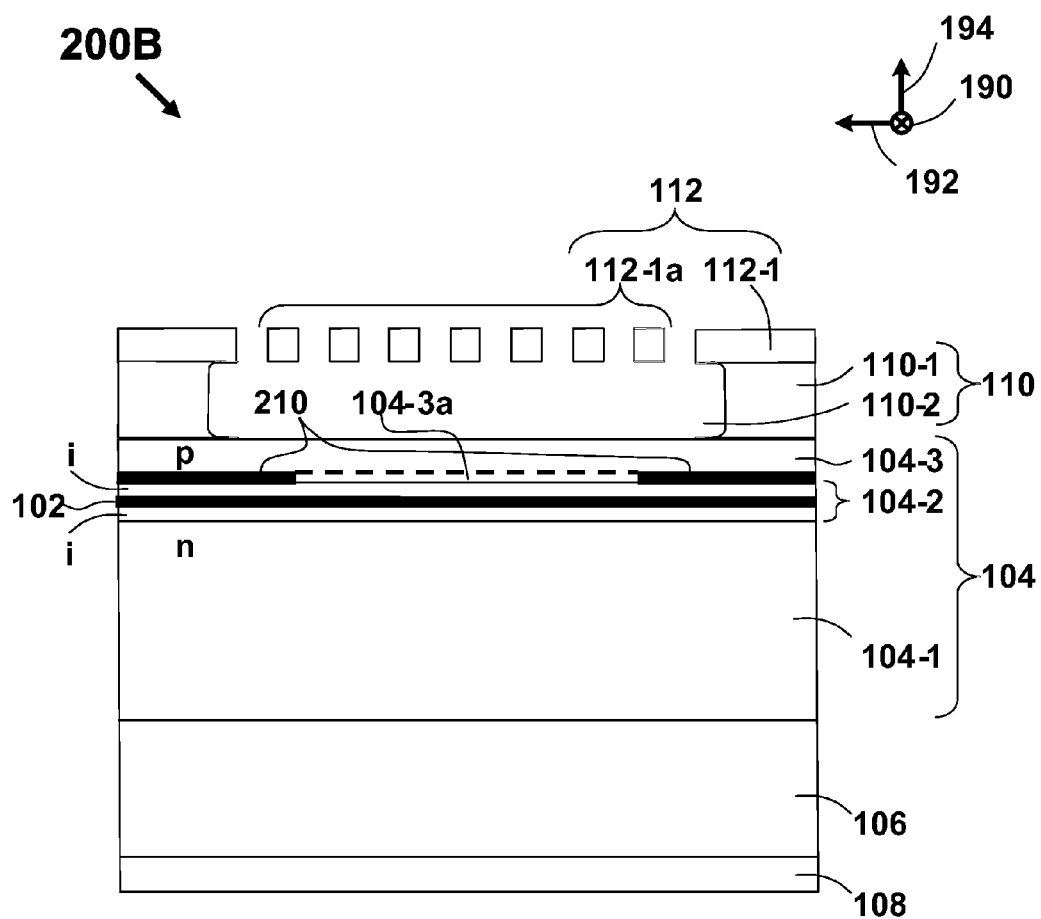
FIG. 2B is a cross-sectional elevation view, through line 2-2 of FIG. 1, of another example of the small-mode-volume VCSEL of FIG. 1A, in accordance with one or more examples of the present invention.

With further reference to FIG. 1A, a line 2-2 is also shown in FIG. 1A that indicates the trace of a plane used to describe cross-sectional elevation views of small-mode-volume VCSEL 101 for the description of various examples of the present invention, as shown in FIGS. 2A and 2B. The arrows adjacent to the 2's shown in FIG. 1A are parallel to vector 190; and, the cross-sectional elevation views of FIGS. 2A and 2B are as viewed looking down the vector 190 from tail towards head, which are subsequently described.

With further reference to FIG. 1A, in accordance with one or more examples of the present invention, the small-mode-volume VCSEL 101 also includes a first electrode 108 and a second electrode 114; the first and second electrodes 108 and 114 are to provide current for the injection of carriers into the active structure 102. As shown in FIG. 1A, in one example of the present invention, the first electrode 108 is disposed below substrate 106, by way of example without limitation thereto. Alternatively, in another example of the present invention, the first electrode 108 may be disposed above the substrate 106 at the front side of DBR 104 below the active structure 102. In another example of the present invention, the second electrode 114 is disposed above the substrate 106 at the front side of DBR 104 above the active structure 102, by way of example without limitation thereto. Alternatively, in another example of the present invention, the second electrode 114 is disposed on top of (not shown) a portion of the grating reflector structure 112 above the active structure 102. If the second electrode 114 is disposed on top of a portion of the grating reflector structure 112, the second electrode 114 is configured so as not to block light 118 emitted from the VCSEL 101.

With further reference to FIG. 1A, in accordance with one or more examples of the present invention, the placement of the first and second electrodes 108 and 114 is configured such that the transport distance that carriers travel from the electrodes to the active structure is made short. Consequently, in one or more examples of the present invention, the light 118 emitted from the small-mode-volume VCSEL 101 is modulated such that a modulation bandwidth of the small-mode-volume VCSEL 101 is on an order of about 100 gigahertz. Thus, in one or more examples of the present invention, including the active structure 102 in DBR 104 helps reduce the amount of material through which carriers are transported to the active structure 102, which is expected to reduce the series electrical resistance of the small-mode-volume VCSEL 101. Consequently, the reduced series electrical resistance of the small-mode-volume VCSEL 101 provides a modulation bandwidth for the small-mode-volume VCSEL 101 that is on the order of about 100 gigahertz during operation. Other examples of the present invention also provide for a reduction in the amount of material through which carriers are transported to the active structure 102 that also provide for a modulation bandwidth for the small-mode-volume VCSEL 101 that is on the order of about 100 gigahertz, which are next described.

Figure 1B:
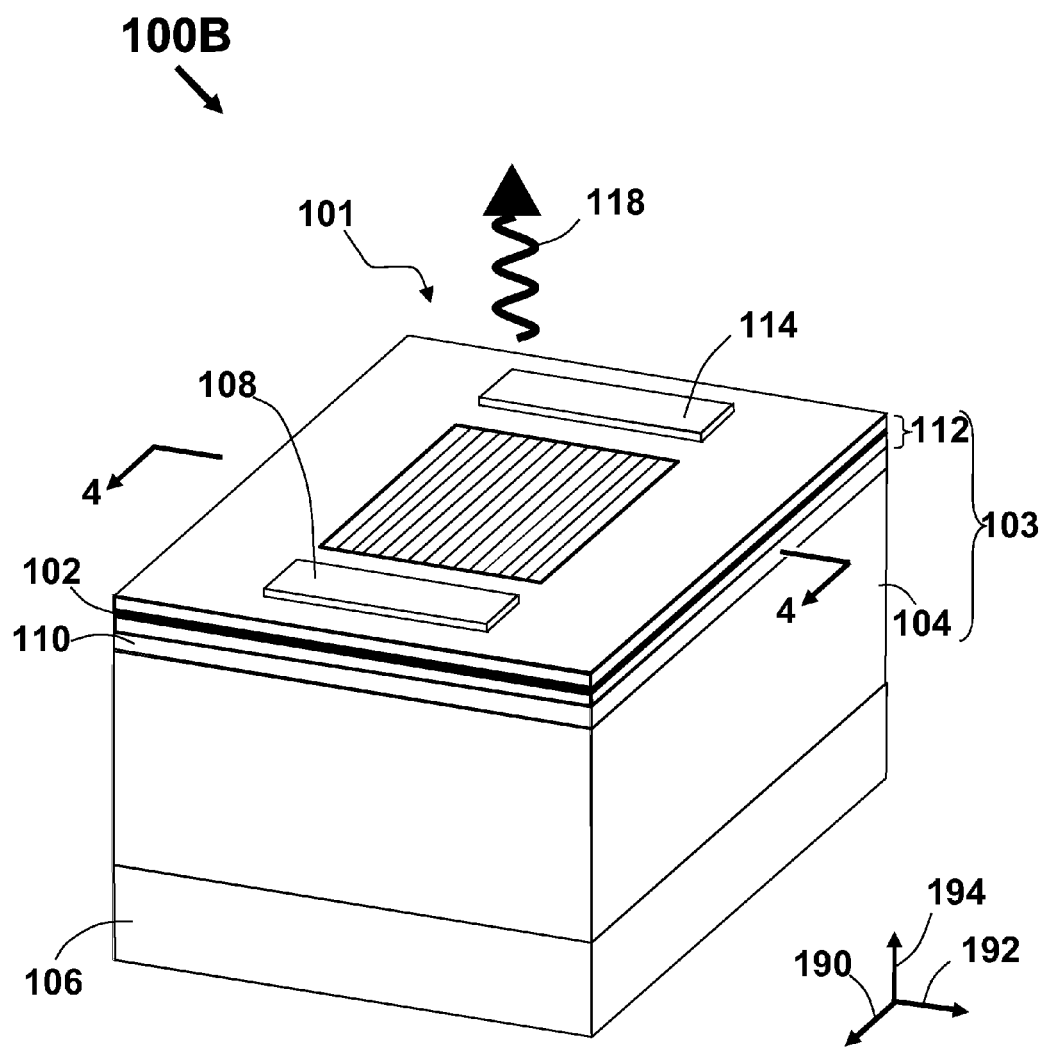
FIG. 1B is a perspective view of another example of a small-mode-volume VCSEL in which an active structure is disposed in a grating reflector structure, in accordance with one or more examples of the present invention.

With reference now to FIG. 1B, in accordance with one or more examples of the present invention, a perspective view 100B is shown of another example of a small-mode-volume VCSEL 101 in which an active structure 102 is disposed instead in a grating reflector structure 112. In accordance with one or more examples of the present invention, the small-mode-volume VCSEL 101 includes two reflecting structures 103 at least one of which is a grating reflector structure 112, and the other a DBR 104, and an active structure 102. The DBR 104 is disposed below the grating reflector structure 112. In accordance with one or more examples of the present invention, the active structure 102 is disposed within the grating reflector structure 112, and is to emit light 118 upon injection of carriers. Similar to FIG. 1A, DBR 104 and the grating reflector structure 112 are configured as a vertical-cavity resonator of small mode-volume, because, in this example of the small-mode-volume VCSEL 101, the active structure 102 is disposed within the grating reflector structure 112.

Similar to FIG. 1A, but with further reference to FIG. 1B, in one or more examples of the present invention, the small-mode-volume VCSEL 101 also includes a first electrode 108 and a second electrode 114; the first and second electrodes 108 and 114 are to provide current for the injection of carriers into the active structure 102. As shown in FIG. 1B, in one example of the present invention, the first and second electrodes 108 and 114 are disposed on top of the grating reflector structure 112, by way of example without limitation thereto. Contacts disposed at opposite sides of the active structure 102 may be provided through isolated via-holes, as is known in the art, without limitation thereto. In accordance with one or more examples of the present invention, the placement of the first and second electrodes 108 and 114 is configured such that the transport distance that carriers travel from the electrodes to the active structure is made short.

With further reference to FIG. 1B, similar to the structure of the small-mode-volume VCSEL 101 shown in FIG. 1A, in one or more examples of the present invention, including the active structure 102 in the grating reflector structure 112 helps reduce the amount of material through which carriers are transported to the active structure 102, which is expected to reduce the series electrical resistance of the small-mode-volume VCSEL 101. Thus, due to the reduced series electrical resistance of the small-mode-volume VCSEL 101, during operation, thermal dissipation within the smallmode-volume VCSEL 101 is sufficiently reduced so that a band gap of the active structure 102 does not appreciably change, which also applies to the structure of the small-mode-volume VCSEL 101 shown in FIG. 1A. Since thermal dissipation within the small-mode-volume VCSEL 101 is low, examples of the present invention provide a small-mode-volume VCSEL 101 with low power dissipation, high thermal stability, stable output amplitude as a function of input power, and low frequency drift. Similarly, in one or more examples of the present invention, the small-mode-volume VCSEL 101 of FIG. 1B may further include a spacer layer 110 that is disposed below the grating reflector structure 112, the function of which is subsequently described in greater detail.

Figure 4A:
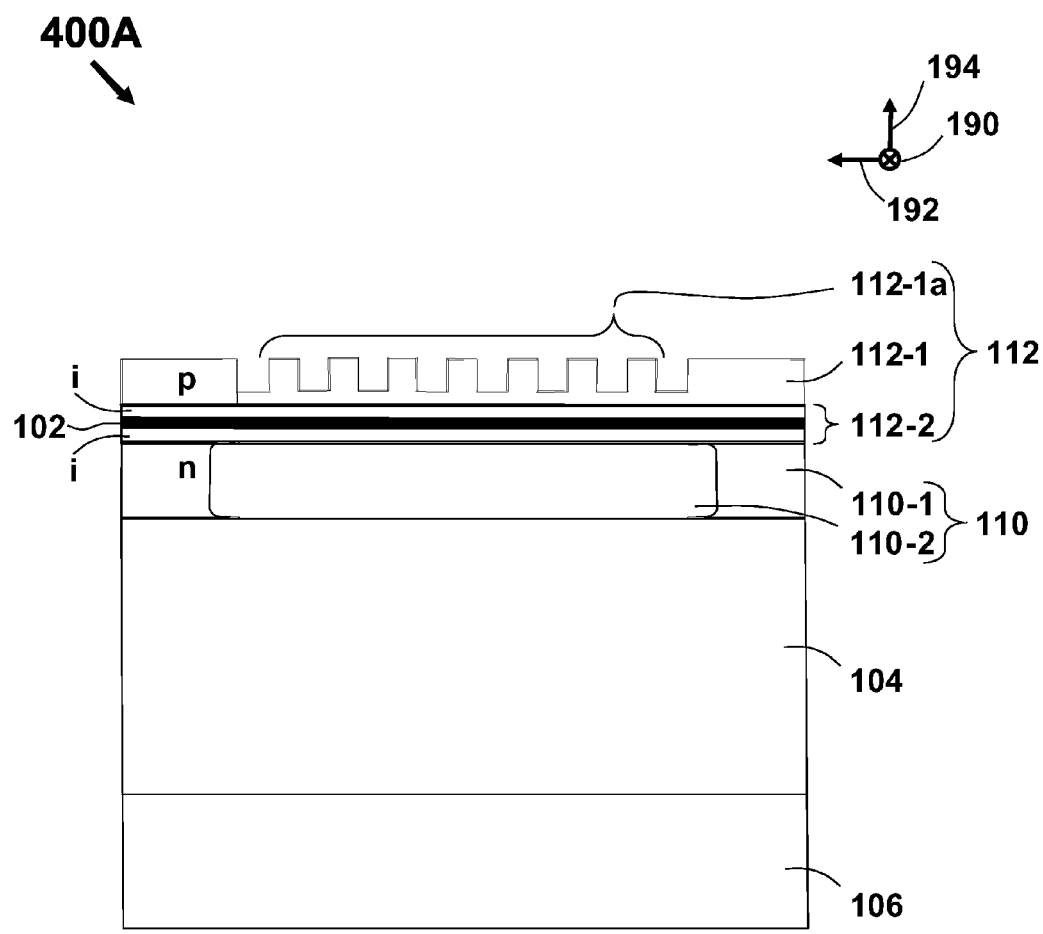
FIG. 4A is a cross-sectional elevation view, through line 4-4 of FIG. 1B, of one example of the small-mode-volume VCSEL of FIG. 1B, in accordance with one or more examples of the present invention.
Figure 4B:
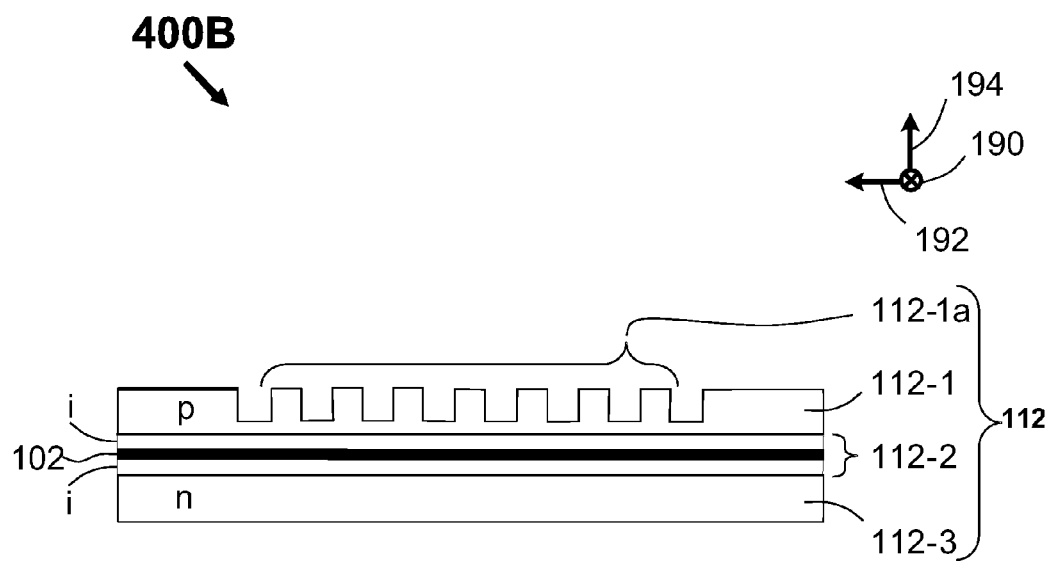
FIG. 4B is a cross-sectional elevation view, through line 4-4 of FIG. 1B, of the grating reflector structure in another example of the small-mode-volume VCSEL of FIG. 1B, in accordance with one or more examples of the present invention.

With further reference to FIG. 1B, triad of vectors 190, 192 and 194 indicates an orientation of perspective view 100B that is substantially the same as the perspective view 100A of FIG. 1A. Similar to line 2-2 of FIG. 1A, a line 4-4 is shown in FIG. 1B that indicates the trace of a plane used to describe cross-sectional elevation views of small-mode-volume VCSEL 101 for the description of various examples of the present invention, as shown in FIGS. 4A and 4B. The arrows adjacent to the 4's shown in FIG. 1A are parallel to vector 190; and, the cross-sectional elevation views of FIGS. 4A and 4B are as viewed looking down the vector 190 from tail towards head, which are subsequently described.

With reference now to FIG. 2A and further reference to FIG. 1A, in accordance with one or more examples of the present invention, a cross-sectional elevation view 200A, through line 2-2 of FIG. 1A, is shown of one example of the small-mode-volume VCSEL 101 of FIG. 1A. Triad of vectors 190, 192 and 194 indicates the orientation of cross-sectional elevation view 200A relative to the perspective view 100A of FIG. 1A. In accordance with one or more examples of the present invention, the small-mode-volume VCSEL 101 may further include a first electrode 108 coupled to a bottom portion 104-1 of DBR 104, and a second electrode 114 (for example, see FIG. 1A) coupled to a top portion 104-3 of DBR 104. As shown in FIG. 2A, first electrode 108 is disposed below substrate 106, by way of example without limitation thereto, as both the first and second electrodes 108 and 114 may directly couple with bottom portion 104-1 and top portion 104-3, respectively, without intervening layers, within the spirit and scope of examples of the present invention.

With further reference to FIGS. 2A and 1A, in accordance with one or more examples of the present invention, the active structure 102 is disposed in a substantially intrinsic portion 104-2 within DBR 104 between the top portion 104-3 and the bottom portion 104-1. As used herein, the term of art, "substantially intrinsic portion," means a portion of material in either the DBR 104, or the grating reflector structure 112, that is undoped except for the portion occupied by the active structure 102, which may include doped material in one or more QWs that is suitably doped to produce carrier confinement within the one or more respective QWs. A p-doped portion, the substantially intrinsic portion 104-2, and an n-doped portion are configured as a vertical p-i-n diode to provide carrier injection into the active structure 102. During operation of the small-mode-volume VCSEL 101, the vertical p-i-n diode structure is forward biased to provide carrier injection into the active structure 102. Similarly, other examples of the present invention, described herein, include numerous configurations of p-i-n diode structures that may be forward biased during operation of the small-mode-volume VCSEL 101. However, other biasing schemes for the p-i-n diode structures that are described herein are also within the spirit and scope of examples of the present invention.

With further reference to FIGS. 2A and 1A, in accordance with one or more examples of the present invention, the top portion 104-3 may include the p-doped portion; and, the bottom portion 104-1 may include the n-doped portion. Alternatively, in another example of the present invention, the top portion 104-3 may include the n-doped portion; and, the bottom portion 104-1 may include the p-doped portion. In accordance with one or more examples of the present invention, grating reflector structure 112 includes at least an upper portion 112-1 that includes a sub-wavelength grating (SWG) 112-1a. By way of example, as shown in FIG. 1A and in FIG. 2A in cross-section, in one example of the present invention, the upper portion 112-1 may be patterned to produce a linear array of bars in SWG 112-1a, without limitation thereto. Other configurations for the SWG 112-1a are also within the spirit and scope of examples of the present invention and are as described in PCT Patent Application, Serial Number PCT/US2010/022632, filed on Jan. 29, 2010, entitled "VERTICAL-CAVITY SURFACE-EMITTING LASERS WITH NON-PERIODIC GRATING." In accordance with one or more examples of the present invention, the SWG 112-1a may be fabricated with a non-periodic grating pattern that provides lateral optical confinement of the light 118.

With further reference to FIGS. 2A and 1A, in accordance with one or more examples of the present invention, the spacer layer 110 includes a support portion 110-1 and a low refractivity portion 110-2. The low refractivity portion 110-2 of the spacer layer 110 has a lower index of refraction than DBR 104. In accordance with one or more examples of the present invention, the low refractivity portion 110-2 of the spacer layer 110 in combination with SWG 112-1a acts as a second reflector opposite to DBR 104 to provide a vertical-cavity resonator of small mode-volume, because, in this example of the small-mode-volume VCSEL 101, the active structure 102 is disposed within the DBR 104. In one example of the present invention, the low refractivity portion 110-2 may be a dielectric material having a low index of refraction, such as a semiconductor oxide, for example, silicon dioxide (SiO$_2$), an oxide of a III-V compound, or alternatively, an oxide of a II-VI compound. In another example of the present invention, the low refractivity portion 110-2 may be a cavity filled with a gas having a low index of refraction, such as air; the low refractivity portion 110-2 may be fabricated by selectively etching away material previously deposited in the spacer layer 110 below the SWG 112-1a to produce the cavity for air.

With reference now to FIG. 2B and further reference to FIG. 1A, in accordance with one or more examples of the present invention, a cross-sectional elevation view 200B, through line 2-2 of FIG. 1, is shown of another example of the small-mode-volume VCSEL 101 of FIG. 1A. Triad of vectors 190, 192 and 194 indicates the orientation of cross-sectional elevation view 200B relative to the perspective view 100A of FIG. 1A. As seen upon comparison of FIG. 2B with FIG. 2A, the configuration of the structure of the small-mode-volume VCSEL 101 shown in FIG. 2B is essentially the same as described above in the discussion of FIG. 2A for the following structures: the grating reflector structure 112 including the upper portion 112-1 that includes the SWG 112-1a; the spacer layer 110 including the support portion 110-1 and the low refractivity portion 110-2; DBR 104 including the bottom portion 104-1, the intrinsic portion 104-2 and the top portion 104-3; the active structure 102; the substrate 106; and, the first electrode 108 and the second electrode 114 (for example, see FIG. 1A).

However, with further reference to FIGS. 1A and 2B, in one or more examples of the present invention, the small-mode-volume VCSEL 101 may further include an oxide aperture layer 210. The oxide aperture layer 210 is disposed between the active structure 102 and the grating reflector structure 112. The oxide aperture layer 210 produces a gain-guided portion 104-3a from where carriers may be injected into the active structure 102. As shown in FIG. 2B, by way of example, in one example of the present invention, top portion 104-3 of DBR 104 includes the gain-guided portion 104-3a, without limitation thereto, as a gain-guided portion and an oxide aperture layer may be disposed elsewhere in the small-mode-volume VCSEL 101 so long as the gain-guided portion confines the carrier current to a portion of the active structure 102 from which light 118 is to be emitted. Moreover, other examples of the present invention provide for other configurations of a gain-guided portion, which is next described.

Figure 3:
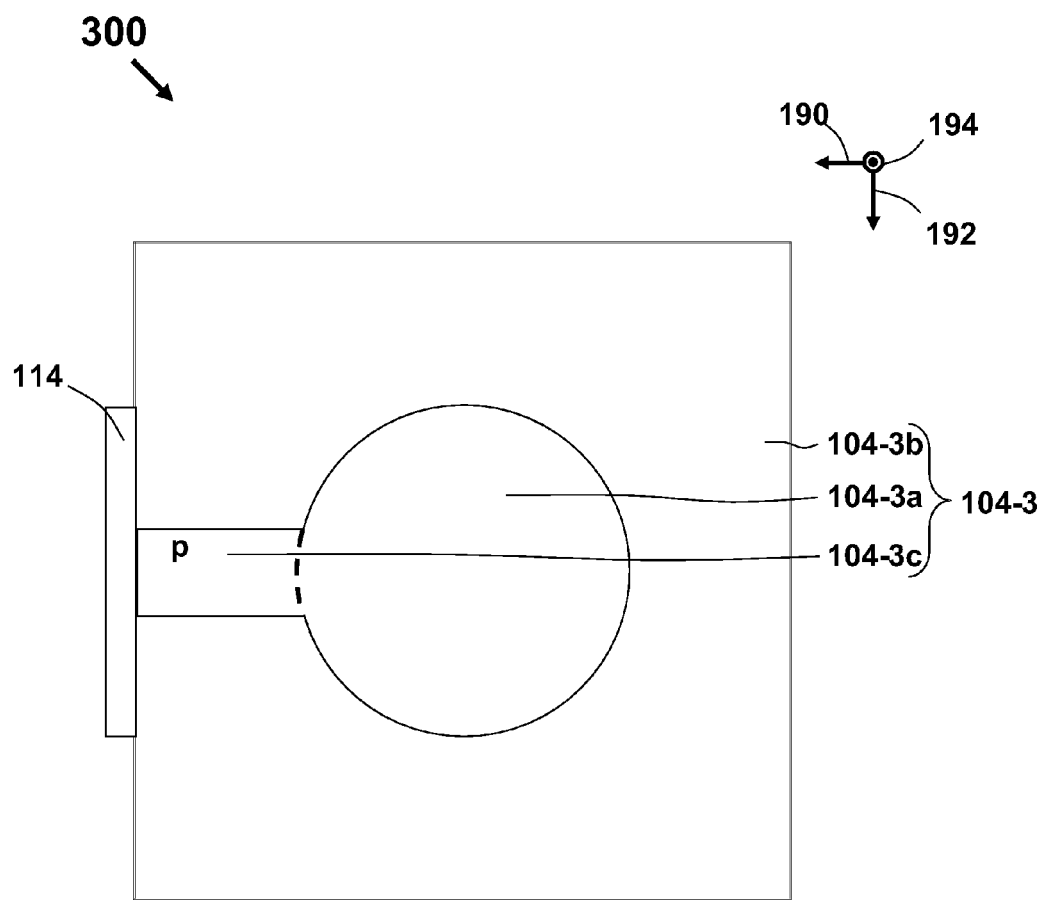
FIG. 3 is a plan view of a top portion of the distributed Bragg reflector of yet another example of the small-mode-volume VCSEL of FIG. 1A, in accordance with one or more examples of the present invention.

With reference now to FIG. 3 and further reference to FIG. 1A, in accordance with one or more examples of the present invention, a plan view 300 is shown of a top portion of DBR 104 of yet another example of the small-mode-volume VCSEL 101 of FIG. 1A. Triad of vectors 190, 192 and 194 indicates the orientation of plan view 300 relative to the perspective view 100A of FIG. 1A. In accordance with one or more examples of the present invention, the configuration of the structure of the small-mode-volume VCSEL 101 corresponding to FIG. 3 is essentially the same as described above in the discussion of FIG. 2A for the following structures: the grating reflector structure 112 including the upper portion 112-1 that includes the SWG 112-1a; the spacer layer 110 including the support portion 110-1 and the low refractivity portion 110-2; DBR 104 including the bottom portion 104-1, the intrinsic portion 104-2 and the top portion 104-3; the active structure 102; the substrate 106; and, the first electrode 108 and the second electrode 114. However, in one or more examples of the present invention, DBR 104 of the small-mode-volume VCSEL 101 of FIG. 1A may be ion implanted to create a high electrical resistance portion 104-3b. As is known in the art, III-V and II-VI compound semiconductors may be implanted with hydrogen ions (H$^+$), or alternatively other ionic species, to produce a region of high electrical resistance. The high electrical resistance portion 104-3b is patterned to produce the gain-guided portion 104-3a of higher electrical conductivity that provides a site from which carriers may be injected into the active structure 102.

As shown in FIG. 3, by way of example, in one example of the present invention, top portion 104-3 of DBR 104 includes the gain-guided portion 104-3a, the high electrical resistance portion 104-3b produced by ion-implantation, and a channel portion 104-3c of higher electrical conductivity. As shown in FIG. 3, in one example of the present invention, the channel portion 104-3c of higher electrical conductivity provides a path for a current of carriers to reach the gain-guided portion 104-3a from the second electrode 114 disposed at the front side of the top portion 104-3. As seen upon comparison of FIG. 3 with FIG. 2B, the configuration of the portion of the structure of the small-mode-volume VCSEL 101 shown in FIG. 3 is similar to the configuration of the structure of the small-mode-volume VCSEL 101 shown in FIG. 2B except that high electrical resistance portion 104-3b is substituted for the oxide aperture layer 210 to provide substantially the same function of limiting the current of carriers to the gain-guided portion 104-3a that the oxide aperture layer 210 provides. Similarly, other examples of the present invention in which a gain-guided portion and a high electrical resistance portion are disposed elsewhere in the small-mode-volume VCSEL 101 are also within the spirit and scope of examples of the present invention, so long as the gain-guided portion directs the carrier current to a portion of the active structure 102 from which light 118 is to be emitted.

With reference now to FIG. 4A and further reference to FIG. 1B, in accordance with one or more examples of the present invention, a cross-sectional elevation view 400A, through line 4-4 of FIG. 1B, is shown of another example of the small-mode-volume VCSEL 101 of FIG. 1B. Triad of vectors 190, 192 and 194 indicates the orientation of cross-sectional elevation view 400A relative to the perspective view 100B of FIG. 1B. As seen upon comparison of FIG. 4A with FIG. 1B, the configuration of the structure of the small-mode-volume VCSEL 101 shown in FIG. 4A is essentially the same as described above in the discussion of FIG. 1B for the following structures: the grating reflector structure 112 including the upper portion 112-1 that includes the SWG 112-1a; the active structure 102; the spacer layer 110 including the support portion 110-1 and the low refractivity portion 110-2; the DBR 104; the substrate 106; and, the first electrode 108 and the second electrode 114 (not shown in FIG. 4A).

However, with further reference to FIGS. 4A and 1B, in one or more examples of the present invention, the small-mode-volume VCSEL 101 may further include a portion that is disposed below the active structure 102 and a grating reflector structure 112 that includes an upper portion 112-1, a substantially intrinsic portion 112-2, and the active structure 102. The active structure 102 is disposed in the substantially intrinsic portion 112-2 below the upper portion 112-1 of the grating reflector structure 112. A p-doped portion, a substantially intrinsic portion 112-2, and an n-doped portion are configured as a vertical p-i-n diode to provide carrier injection into the active structure 102. In one example of the present invention, the upper portion 112-1 may include the p-doped portion; and, the portion that is disposed below the active structure 102 may include the n-doped portion. Alternatively, in another example of the present invention, the upper portion 112-1 may include the n-doped portion; and, the portion that is disposed below the active structure 102 may include the p-doped portion.

With further reference to FIGS. 4A and 1B, in accordance with one or more examples of the present invention, grating reflector structure 112 includes at least an upper portion 112-1 that includes a SWG 112-1a. By way of example, as shown in FIG. 1B and in FIG. 4A in cross-section, in one example of the present invention, the upper portion 112-1 may be patterned to produce a linear array of bars in SWG 112-1a, without limitation thereto. Other configurations for the SWG 112-1a are also within the spirit and scope of examples of the present invention, as previously described. In accordance with one or more examples of the present invention, the SWG 112-1a may be fabricated with a non-periodic grating pattern that provides lateral optical confinement of the light 118.

With further reference to FIGS. 4A and 1B, the SWG 112-1a may be produced by a variety of etching techniques, as known in the art. However, if the etch depth of the recessed regions of an SWG extend into the intrinsic portion 112-2 the side walls of the non-recessed portions, for example, the side walls of the bars between the recessed regions, may act as sites for the recombination of carriers, which may reduce the electroluminescent efficiency of the small-mode-volume VCSEL 101. Therefore, as shown in FIG. 4A and similarly FIG. 4B, in one example of the present invention, the etch depth is controlled so as not to cross into the intrinsic portion 112-2 such that the SWG 112-1a is disposed in the upper portion 112-1 of the grating reflector structure 112, which is a single doped portion. Alternatively, in other examples of the present invention (not shown in FIG. 4A), side walls of the non-recessed portions, which are fabricated such that the side walls are located at the junctions between differently doped portions, for example, between a p-doped upper portion 112-1 and an intrinsic portion 112-2, without limitation thereto, may be treated to reduce the recombination of carriers at such sites, for example, by passivating the surfaces of the side walls.

With further reference to FIGS. 4A and 1B, in accordance with one or more examples of the present invention, the spacer layer 110 includes a support portion 110-1 and a low refractivity portion 110-2. The low refractivity portion 110-2 of the spacer layer 110 has a lower index of refraction than DBR 104. In accordance with one or more examples of the present invention, the low refractivity portion 110-2 of the spacer layer 110 in combination with SWG 112-1a acts as a second reflector opposite to DBR 104, as previously described. In one example of the present invention, the low refractivity portion 110-2 may be a dielectric material having a low index of refraction, as previously described. In another example of the present invention, the low refractivity portion 110-2 may be a cavity filled with a gas having a low index of refraction, such as air; as previously described. As shown in FIG. 4A, by way of example, in one example of the present invention, the portion that is disposed below the active structure 102 includes the spacer layer 110. By way of further example, in one example of the present invention, the portion that is disposed below the active structure 102 includes the support portion 110-1 of the spacer layer 110, which is an n-doped portion of semiconductor material when the upper portion 112-1 is a p-doped portion, without limitation thereto, as the support portion 110-1 may be a p-doped if the upper portion 112-1 is an n-doped portion. However, examples of the present invention are not limited to a portion that is disposed below the active structure 102 that just includes the spacer layer 110, as is next described.

With reference now to FIG. 4B and further reference to FIG. 1B, in accordance with one or more examples of the present invention, a cross-sectional elevation view 400B, through line 4-4 of FIG. 1B, is shown of the grating reflector structure 112 of another example of the small-mode-volume VCSEL 101 of FIG. 1B. Triad of vectors 190, 192 and 194 indicates the orientation of cross-sectional elevation view 400B relative to the perspective view 100B of FIG. 1B. The configuration of the structure of the small-mode-volume VCSEL 101 corresponding to FIG. 4B is essentially the same as described above in the discussion of FIGS. 1B and 4A for the following structures: the grating reflector structure 112 including the upper portion 112-1 that includes the SWG 112-1a; the spacer layer 110 including the support portion 110-1 and the low refractivity portion 110-2; DBR 104 including the bottom portion 104-1, the intrinsic portion 104-2 and the top portion 104-3; the active structure 102; the substrate 106; and, the first electrode 108 and the second electrode 114.

However, as shown in FIG. 4B, in another example of the present invention, the grating reflector structure 112 includes a lower portion 112-3, in addition to the upper portion 112-1 that includes the SWG 112-1a and the intrinsic portion 112-2 that includes the active structure 102. In accordance with examples of the present invention, the portion that is disposed below the active structure 102 includes the lower portion 112-3 of the grating reflector structure 112. Thus, the grating reflector structure, itself, includes a vertical p-i-n diode that provides carrier injection into the active structure 102. By way of example, as shown in FIG. 4B, in one example of the present invention, the upper portion 112-1 includes the p-doped portion; and, the lower portion 112-3 includes the n-doped portion. Alternatively, in another example of the present invention, the upper portion 112-1 includes the n-doped portion; and, the lower portion 112-3 includes the p-doped portion. As previously described in the discussion of FIG. 1B, the first and second electrodes 108 and 114 may be disposed on top of the grating reflector structure 112 such that contacts to opposite sides of the p-i-n diode may be provided through isolated via-holes, as is known in the art. However, alternative current carrier injection schemes are also within the spirit and scope of examples of the present invention, as is next described.

Figure 5:
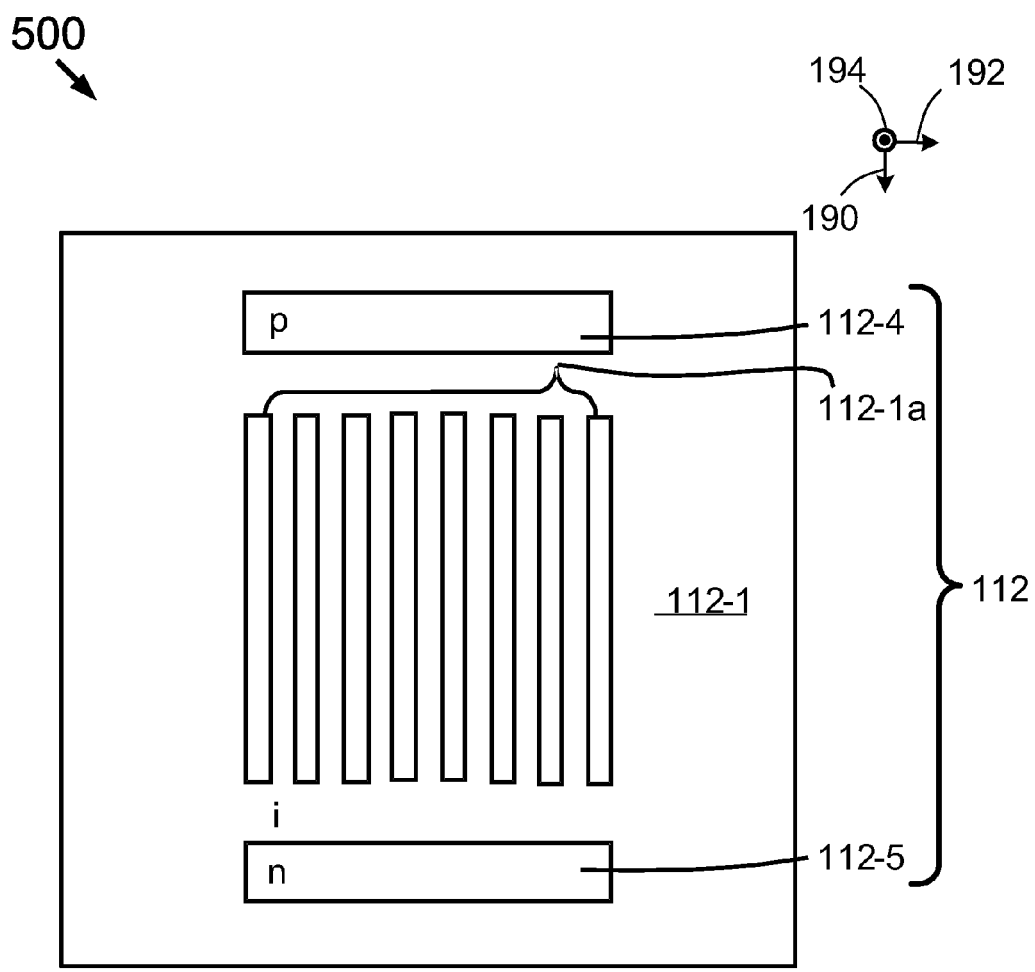
FIG. 5 is a plan view of an upper portion of the grating reflector structure of yet another example of the small-mode-volume VCSEL of FIG. 1B, in accordance with one or more examples of the present invention.

With reference now to FIG. 5 and further reference to FIG. 1B, in accordance with one or more examples of the present invention, a plan view 500 is shown of an upper portion 112-1 of the grating reflector structure 112 of yet another example of the small-mode-volume VCSEL 101 of FIG. 1B. Triad of vectors 190, 192 and 194 indicates the orientation of plan view 500 relative to the perspective view 100B of FIG. 1B. In accordance with one or more examples of the present invention, the small-mode-volume VCSEL 101 may further include a p-doped portion 112-4 and an n-doped portion 112-5. The p-doped portion 112-4 is disposed adjacent to a first side of SWG 112-1a of the grating reflector structure 112. The n-doped portion 112-5 is disposed adjacent to a second side of SWG 112-1a of the grating reflector structure 112. As shown in FIG. 5, the upper portion 112-1 includes a substantially intrinsic portion of the grating reflector structure 112. The active structure 102 is disposed within the substantially intrinsic portion, and is coupled with the p-doped portion 112-4 and the n-doped portion 112-5. The p-doped portion 112-4, the substantially intrinsic portion included in the upper portion 112-1, and the n-doped portion 112-5 are configured as a lateral p-i-n diode to provide carrier injection into the active structure 102. Similar to electrical contact schemes previously described in the discussion of FIG. 1B, the first and second electrodes 108 and 114 may be disposed on top of the grating reflector structure 112. However, in one example of the present, contacts to opposite sides of the lateral p-i-n diode may be made by direct contact of the first electrode 108 within the n-doped portion 112-5 and by direct contact of the second electrode 114 within the p-doped portion 112-4.

The above-described examples of the present invention provide various examples of a small-mode-volume VCSEL 101 in which the active structure 102 is no longer disposed in a cavity between a DBR and a grating reflector of a VCSEL, but rather, is placed either in the DBR 104, or alternatively, in the grating reflector structure 112. Thus, in examples of the present invention, the cavity length can be shrunk so that the cavity includes a thin layer of air, or alternatively, a low index-of-refraction material, between the DBR 104 and the SWG 112-1a. In accordance with examples of the present invention, the shrunken cavity length opens the way to the novel carrier-injection schemes, described above, for example, a small-mode-volume VCSEL 101 without the oxide aperture layer 210 such as shown in FIGS. 2A, 3, 4A, 4B and 5, although carrier-injection schemes including the oxide aperture layer 210, as shown in FIG. 2B, are also within the spirit and scope of examples of the present invention. Moreover, the above-described examples of the present invention may be combined with non-periodic patterning of the SWG 112-1a, as described in PCT Patent Application, Serial Number PCT/US2010/022632, entitled "VERTICAL-CAVITY SURFACE-EMITTING LASERS WITH NON-PERIODIC GRATING," to provide optical confinement of the light 118 emitted from the small-mode-volume VCSEL 101. Thus, examples of the present invention provide a small-mode-volume VCSEL 101 that can be operated at high speed on the order of about 100 GHz in direct modulation. Furthermore, in examples of the present invention, during operation, power output of the small-mode-volume VCSEL 101 is on an order of about 1 milliwatt. Thus, the above-described examples of the present invention provide various examples of the small-mode-volume VCSEL 101 that are well-suited to data-communication applications; and, examples of the present invention for data-communication environments are next described.

Figure 6A:
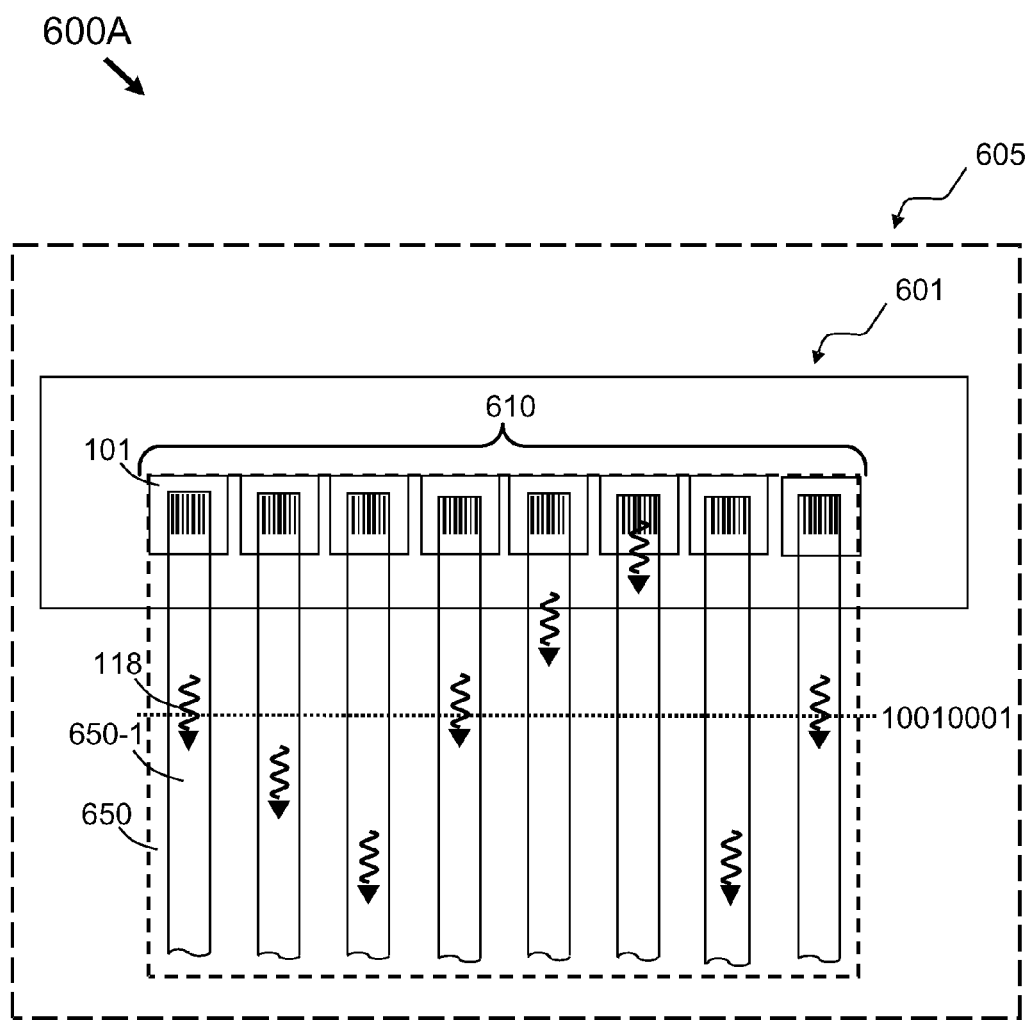
FIG. 6A is a schematic diagram of an optical-bus transmitter including a plurality of small-mode-volume VCSELs of which the small-mode-volume VCSEL of FIG. 1A, or alternatively

With reference now to FIG. 6A and further reference to FIGS. 1A-5, in accordance with one or more examples of the present invention, a schematic diagram 600A is shown of an optical-bus transmitter 601 including a plurality 610 of small-mode-volume VCSELs, of which small-mode-volume VCSEL 101 is an example. Examples of the present invention for the small-mode-volume VCSEL 101 of FIGS. 1A-5 are incorporated within the environment of the optical bus transmitter 601. In accordance with one or more examples of the present invention, a small-mode-volume VCSEL 101 of the plurality 610 is configured as an optical output driver for a bit-line, for example, bit-line 650-1, of an optical bus 650. Each bit-line in optical bus 650 is to receive light emitted from a small-mode-volume VCSEL of the optical-bus transmitter 601; for example, bit-line 650-1 is to receive light 118 emitted from small-mode-volume VCSEL 101 of the plurality 610 of small-mode-volume VCSELs in the optical-bus transmitter 601. As shown in FIG. 6A, the bit-lines in optical bus 650 may be to transmit a byte of information associated in positive logic with a bit corresponding to a pulse of light emitted from selected small-mode-volume VCSELs of the plurality 610.

For example, with further reference now to FIGS. 1A-6A, a pulse of light 118 emitted from small-mode-volume VCSEL 101 corresponds to a first bit, a logical "1," of an eight-bit byte, given by bit-string "10010001," which corresponds to pulses of light emitted from selected small-mode-volume VCSELs of the plurality 610 (as is indicated by the dotted line in FIG. 6A). By way of example, FIG. 6A shows the optical bus 650 configured for the transmission of eight-bit bytes, without limitation thereto. However, optical-buses including more or less bit-lines than shown in FIG. 6A are also within the spirit and scope of examples of the present invention. Moreover, by way of example, the optical bus 650 in FIG. 6A has been so far described as transmitting bytes in a parallel-bus configuration; but, the optical bus 650 may also transmit bytes serially on each individual bit-line, in accordance with one or more examples of the present invention.

In FIG. 6A, in accordance with one or more examples of the present invention, the schematic diagram 600A also shows an example system 605 including at least one optical bus 650 and at least one optical-bus transmitter 601. However, examples of the present invention also include within their spirit and scope systems with other components integrated with the one or more optical buses and optical-bus transmitters, similar to optical bus 650 and optical-bus transmitter 601, which are next described.

Figure 6B:
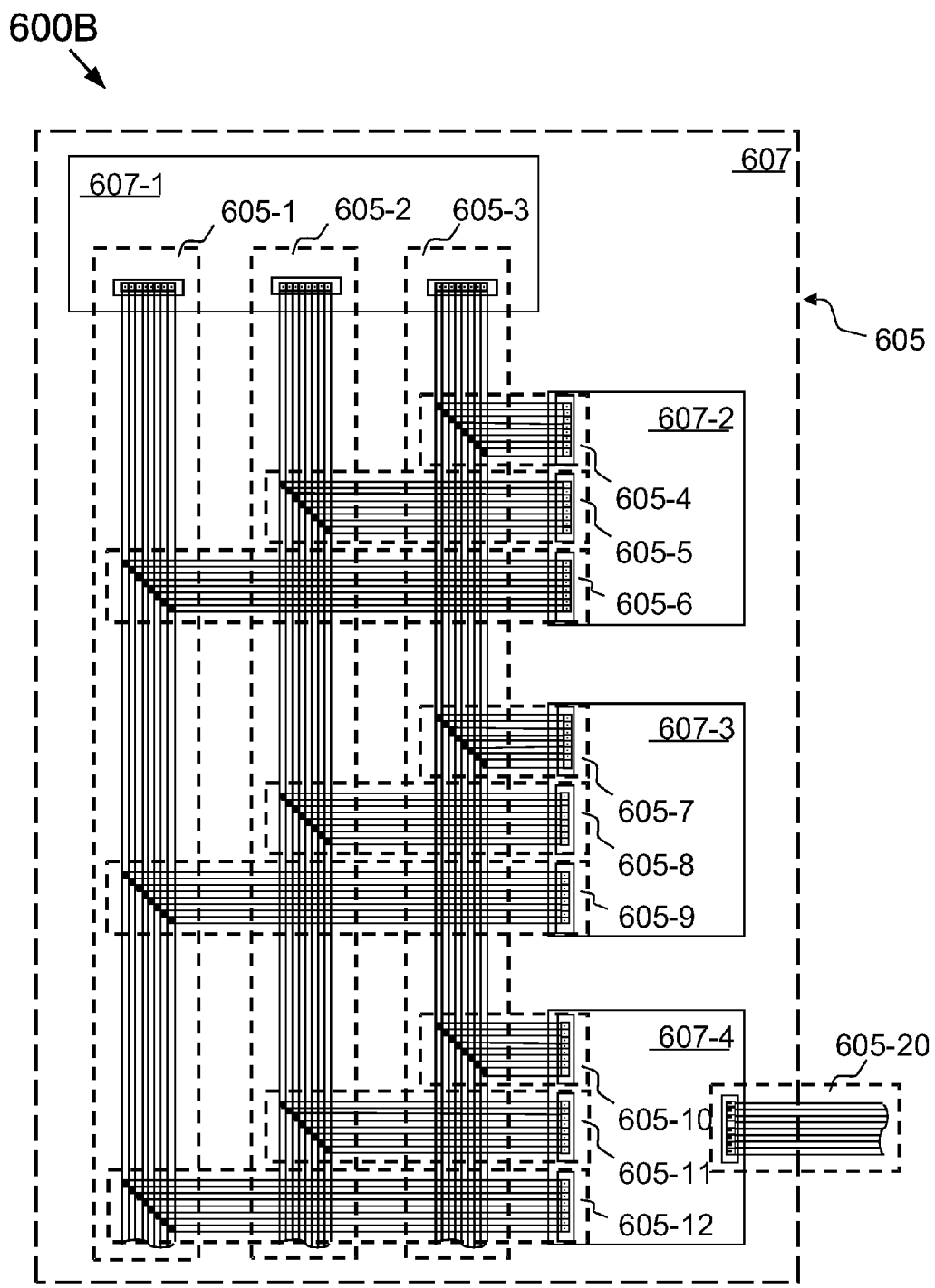
FIG. 6B is a schematic diagram of another example system, a digital-information processor, including at least one optical bus and at least one optical-bus transmitter of FIG. 6A, in accordance with one or more examples of the present invention.

With reference now to FIG. 6B and further reference to FIG. 6A, in accordance with one or more examples of the present invention, a schematic diagram 600B is shown of yet another example system 605, which includes a digital-information processor 607, including at least one optical bus and at least one optical-bus transmitter, for example, optical bus 650 and optical-bus transmitter 601. In accordance with one or more examples of the present invention, the system 605 may further include an integrated combination of components, for example, a digital-information processor 607. In accordance with one or more examples of the present invention, the digital-information processor 607 includes a plurality of components 607-1, 607-2, 607-3 and 607-4 integrated with at least one optical-bus and at least one optical-bus transmitter. In accordance with one or more examples of the present invention, at least one optical-bus and at least one optical-bus transmitter are to transfer information between one component and another component coupled to the optical-bus in the digital-information processor 607. As used herein, a digital-information processor 607 includes an electronic apparatus that processes at least some information in digital form, for example, a computer, a server, or a digital-electronic apparatus, without limitation thereto, such that the digital information is conveyed by at least one optical bus and at least one optical-bus transmitter. For example, digital-information processor 607 may include a server including components 607-1, 607-2, 607-3 and 607-4 such that components 607-1, 607-2, 607-3 and 607-4 are: a central processing unit (CPU), a program memory, a data memory, and an input/output module, respectively.

With further reference to FIGS. 6A and 6B, in accordance with one or more examples of the present invention, digital-information processor 607 is integrated with plurality of components 607-1, 607-2, 607-3 and 607-4 with a plurality of combined optical-bus/optical-bus transmitters 605-1, 605-2, 605-3, 605-4, 605-5, 605-6, 605-7, 605-8, 605-9, 605-10, 605-11 and 605-12, similar to the optical bus 650 and optical-bus transmitter 601 of FIG. 6A. As shown in FIG. 6B, the respective combined optical-bus/optical-bus transmitters 605-1, 605-2 and 605-3 are coupled with components 607-2, 607-3 and 607-4 by respective combined optical-bus/optical-bus transmitters: combined optical-bus/optical-bus transmitter 605-1 is coupled with components 607-2, 607-3 and 607-4 by respective combined optical-bus/optical-bus transmitters 605-6, 605-9 and 605-12; combined optical-bus/optical-bus transmitter 605-2 is coupled with components 607-2, 607-3 and 607-4 by respective combined optical-bus/optical-bus transmitters 605-5, 605-8 and 605-11; and, combined optical-bus/optical-bus transmitter 605-3 is coupled with components 607-2, 607-3 and 607-4 by respective combined optical-bus/optical-bus transmitters 605-4, 605-7 and 605-10. As shown in FIG. 6B, by way of example, the combined optical-bus/optical-bus transmitters are configured as bi-directional devices such that an optical-bus transmitter is disposed at ends of an optical bus, without limitation thereto.

Moreover, with further reference to FIGS. 6A and 6B, optical-bus receivers (not shown) may be interfaced to one or another end of an optical bus such that bi-directional and uni-directional optical buses are within the spirit and scope of examples of the present invention. By way of further example, in one example of the present invention, for the system 605 including a server as digital-information processor 607, the CPU, component 607-1, may be integrated with the program memory, the data memory, and the input/output module, respectively, components 607-2, 607-3 and 607-4, with a data bus, a control bus and an address bus. For one example of the present invention in which the system 605 includes the server, the data bus is included in respective combined optical-bus/optical-bus transmitters 605-1, 605-6, 605-9 and 605-12; the control bus is included in respective combined optical-bus/optical-bus transmitters 605-2, 605-5, 605-8 and 605-11; and, the address bus is included in respective combined optical-bus/optical-bus transmitters 605-3, 605-4, 605-7 and 605-10. As shown in FIG. 6B, in another example of the present invention, the digital-information processor 607 may include an input/output module, component 607-4, that is coupled with a combined optical-bus/optical-bus transmitter 605-20 that provides for the input and output of digital information to and from the digital-information processor 607, for example, a server, which is next described.

Figure 6C:
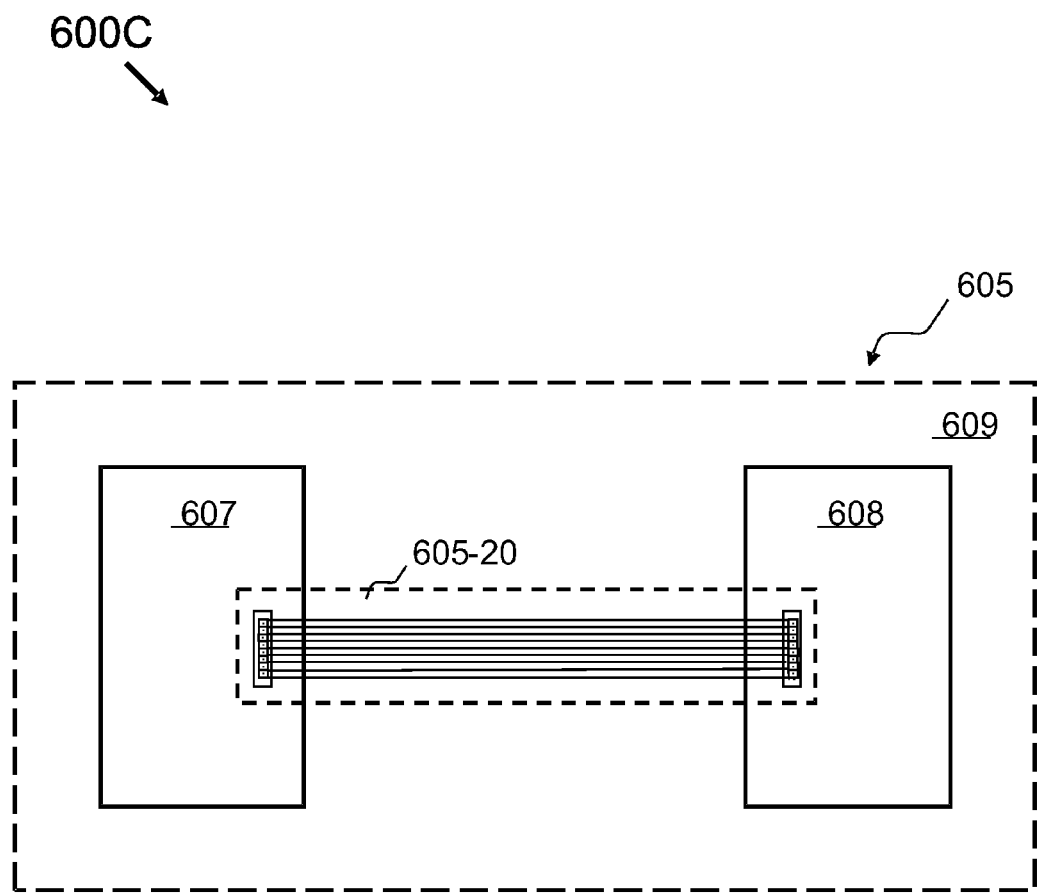
FIG. 6C is a schematic diagram of yet another example system, a data-processing center, including at least one optical bus and at least one optical-bus transmitter of FIG. 6A, in accordance with one or more examples of the present invention.

With reference now to FIG. 6C and further reference to FIGS. 6A and 6B, in accordance with one or more examples of the present invention, a schematic diagram 600C is shown of yet another example system 605, a data-processing center 609 including at least one optical bus and at least one optical-bus transmitter, for example, optical bus 650 and optical-bus transmitter 601 of FIG. 6A. In accordance with one or more examples of the present invention, the system 605 may further include an integrated combination of components, for example, a data-processing center 609. In accordance with one or more examples of the present invention, the data-processing center 609 includes a plurality of digital-information processors, for example, digital-information processors 607 and 608, integrated with at least one optical-bus and at least one optical-bus transmitter, for example, combined optical-bus/optical-bus transmitter 605-20. In accordance with one or more examples of the present invention, at least one optical-bus and at least one optical-bus transmitter are to transfer information between one digital-information processor 607 and another digital-information processor 608 coupled to the optical-bus in the data-processing center 609. By way of example, in one example of the present invention, data-processing center 609 may include one server, including digital-information processor 607, and another server, including digital-information processor 608, without limitation thereto. However, examples of the present invention also include within their spirit and scope systems that include a plurality of servers integrated with one or more combined optical-bus/optical-bus transmitters, of which combined optical-bus/optical-bus transmitter 605-20 is an example.

The foregoing descriptions of specific examples of the present invention have been presented for purposes of illustration and description. They are not intended to be exhaustive or to limit the invention to the precise forms disclosed, and many modifications and variations are possible in light of the above teaching. The examples described herein were chosen and described in order to best explain the principles of the invention and its practical application, to thereby enable others skilled in the art to best utilize the invention and various examples with various modifications as are suited to the particular use contemplated. It may be intended that the scope of the invention be defined by the claims appended hereto and their equivalents.

What is claimed is:

1. A small-mode-volume, vertical-cavity, surface-emitting laser, said laser comprising:
    two reflecting structures, at least one of which is a grating reflector structure; and
    an active structure to emit light upon injection of carriers, said active structure disposed within a substantially intrinsic portion of said at least one of said reflecting structures,
    wherein said reflecting structures are configured as a vertical-cavity resonator of small mode-volume.

2. The small-mode-volume, vertical-cavity, surface-emitting laser of claim 1, further comprising:
    a distributed Bragg reflector, said distributed Bragg reflector being another of said two reflecting structures and disposed below said grating reflector structure;
    a first electrode coupled to a bottom portion of said distributed Bragg reflector; and
    a second electrode coupled to a top portion of said distributed Bragg reflector,
    wherein said active structure is disposed in said substantially intrinsic portion within said distributed Bragg reflector between said top portion and said bottom portion;
    wherein a p-doped portion, said substantially intrinsic portion, and an n-doped portion are configured as a vertical p-i-n diode to provide carrier injection into said active structure; and
    wherein said p-doped portion and said n-doped portion are selected from the group consisting of said top portion and said bottom portion, respectively, and said bottom portion and said top portion, respectively.

3. The small-mode-volume, vertical-cavity, surface-emitting laser of claim 2, further comprising:
    an oxide aperture layer disposed between said active structure and said grating reflector structure to produce a gain-guided portion from where carriers may be injected into said active structure.

4. The small-mode-volume, vertical-cavity, surface-emitting laser of claim 2, wherein said distributed Bragg reflector is ion implanted to create a high electrical resistance portion, said high electrical resistance portion patterned to produce a gain-guided portion from where carriers may be injected into said active structure.

5. The small-mode-volume, vertical-cavity, surface-emitting laser of claim 1, further comprising:
    a portion disposed below said active structure, wherein said at least one grating reflector structure, which comprises said substantially intrinsic portion, further comprises:
    an upper portion, wherein said active structure is disposed in said substantially intrinsic portion below said upper portion,
    wherein a p-doped portion, said substantially intrinsic portion, and n-doped portion are configured as a vertical p-i-n diode to provide carrier injection into said active structure, and
    wherein said p-doped portion and said n-doped portion are selected form the group consisting of said upper portion and said portion disposed below said active structure, respectively, and said portion disposed below said active structure and said upper portion, respectively.

6. The small-mode-volume, vertical-cavity, surface-emitting laser of claim 5, wherein said portion disposed below said active structure comprises:
    a structure selected from the group consisting of a lower portion of said grating reflector structure and a space layer.

7. The small-mode-volume, vertical-cavity, surface-emitting laser of claim 1, further comprising:

an upper portion comprising:
   said substantially intrinsic portion of said grating reflector structure;
   a p-doped portion disposed adjacent to a first side of a sub-wavelength grating of said grating reflector structure; and
   an n-doped portion disposed adjacent to a second side of said grating of said grating reflector structure,
     wherein said active structure is coupled with said p-doped portion and said n-doped portion, and
     wherein said p-doped portion, said substantially intrinsic portion included in said upper portion, and said n-doped portion are configured as a lateral p-i-n diode to provide carrier injection into said active structure.

8. The small-mode-volume, vertical-cavity, surface-emitting laser of claim 1, wherein thermal dissipation during operation is sufficiently reduced so that a band gap of said active structure does not appreciably change.

9. The small-mode-volume, vertical-cavity, surface-emitting laser of claim 1, wherein power output during operation is on an order of about 1 milliwatt.

10. The small-mode-volume, vertical-cavity, surface-emitting laser of claim 1, further comprising:
   a spacer layer disposed below said grating reflector structure,
   wherein a low refractivity portion of said spacer layer has a lower index of refraction than a distributed Bragg reflector.

11. The small-mode-volume, vertical-cavity, surface-emitting laser of claim 10, wherein said low refractivity portion is selected from the group consisting of a dielectric material having a low index of refraction and a cavity filled with a gas having a low index of refraction.

12. The small-mode-volume, vertical-cavity, surface-emitting laser of claim 1, wherein said light has a wavelength from about 400 nanometers to about 1300 nanometers, and is modulated such that a modulation bandwidth is on an order of about 100 gigahertz.

13. An optical-bus transmitter, comprising:
   a plurality of small-mode-volume, vertical-cavity, surface-emitting lasers, a laser of said plurality comprising:
     two reflecting structures, at least one of which is a grating reflector structure; and
     an active structure to emit light upon injection of carriers, said active structure disposed within a substantially intrinsic portion of said at least one of said reflecting structures,
   wherein said reflecting structures are configured as a vertical cavity resonator of small mode-volume, and
   wherein said small-mode-volume, vertical-cavity, surface-emitting laser of said plurality is configured as an optical output driver for a bit line of an optical bus.

14. A system comprising:
at least one optical bus; and
at least one optical-bus transmitter coupled with said optical bus, said optical-bus transmitter comprising:
   a plurality of small-mode-volume, vertical-cavity, surface-emitting lasers, a laser of said plurality comprising:
     two reflecting structures, at least one of which is a grating reflector structure: and
     an active structure to emit light upon injection of carriers, said active structure disposed within a substantially intrinsic portion of said at least one of said reflecting structures,
   wherein said reflecting structures are configured as a vertical cavity resonator of small mode-volume, and
   wherein said small-mode-volume, vertical-cavity, surface-emitting laser of said plurality is configured as an optical output driver for bit-line of said optical bus.

15. The system of claim 14, further comprising:
an integrated combination of components selected from the group consisting of a digital-information processor comprising:
   a plurality of components integrated with said optical-bus; and
   at least one optical-bus transmitter, wherein said optical-bus and at least one optical-bus transmitter are to transfer information between one component and another component coupled to said optical-bus in said digital-information processor,
and a data-processing center comprising:
   plurality of digital-information processors wherein said optical-bus and at least one optical-bus transmitter are to transfer information between one digital-information processor and at least one other digital-information processor coupled to said optical-bus in said data-processing center.

\* \* \* \* \*